US012785664B2

(12) United States Patent
Bobick

(10) Patent No.: US 12,785,664 B2
(45) Date of Patent: Nov. 3, 2026

(54) SAMPLING RATE CONVERTER WITH LINE FREQUENCY AND PHASE LOCKED LOOPS FOR ENERGY METERING

(71) Applicant: Landis+Gyr Innovations, Inc., Alpharetta, GA (US)

(72) Inventor: David A. Bobick, West Lafayette, IN (US)

(73) Assignee: Landis+Gyr Technology, Inc., Alpharetta, GA (US)

( * ) Notice: Subject to any disclaimer, the term of this patent is extended or adjusted under 35 U.S.C. 154(b) by 24 days.

(21) Appl. No.: 17/522,606

(22) Filed: Nov. 9, 2021

(65) Prior Publication Data

US 2023/0143318 A1 May 11, 2023

(51) Int. Cl.
*H03H 17/02* (2006.01)
*G01R 21/133* (2006.01)

(52) U.S. Cl.
CPC ....... *H03H 17/0252* (2013.01); *G01R 21/133* (2013.01)

(58) Field of Classification Search
CPC .............. H03H 17/0252; G01R 21/133; G01R 19/2513; G01R 22/10; G01R 23/02; G01R 23/167
See application file for complete search history.

(56) References Cited

U.S. PATENT DOCUMENTS 4,782,324 A * 11/1988 Underwood ....... H03H 17/0252 341/147
5,103,675 A * 4/1992 Komninos .............. G01M 3/24 381/98
5,321,350 A * 6/1994 Haas ...................... G01R 23/02 702/75

(Continued)

OTHER PUBLICATIONS

Borkowski et al., "Improvement of Accuracy of Power System Spectral Analysis by Coherent Resampling", IEEE Xplore, vol. 24, No. 3, May 8, 2009, pp. 1004-1013.

(Continued)

*Primary Examiner* — Kyle R Quigley
(74) *Attorney, Agent, or Firm* — Kilpatrick Townsend & Stockton LLP

(57) ABSTRACT

A method of processing power signals is provided. The method includes: receiving an analog poly-phase signal associated with power delivered using alternating current (AC); converting the analog poly-phase signal to a digital poly-phase signal sampled at a first sampling rate; detecting a fundamental frequency of the analog poly-phase signal; determining a second sampling rate, wherein the second sampling rate is based on and tracks the fundamental frequency; resampling the digital poly-phase signal at the second sampling rate; for each cycle of the resampled digital poly-phase signal: transforming the resampled digital poly-phase digital signal to a frequency-domain signal; calculating a phase angle of the reference voltage component;

(Continued)

adjusting the resampled digital poly-phase signal by compensating the calculated phase angle; and transforming the adjusted resampled digital poly-phase signal to an updated frequency-domain signal using FFT; and calculating one or more measurements based on the updated frequency-domain signal.

13 Claims, 9 Drawing Sheets

(56) References Cited

U.S. PATENT DOCUMENTS

| | | | | | |
|---|---|---|---|---|---|
| 5,706,222 | A * | 1/1998 | Bonaccio | G11B 20/10009 | 360/40 |
| 5,917,735 | A * | 6/1999 | Ko | H03H 17/0275 | 708/313 |
| 6,081,768 | A * | 6/2000 | Hu | H02H 7/04 | 702/66 |
| 6,130,531 | A * | 10/2000 | Hao | G01R 25/00 | 361/85 |
| 8,847,576 | B1 * | 9/2014 | Hannam | G01R 15/186 | 324/330 |
| 8,970,254 | B1 * | 3/2015 | Murphy | H04L 25/4902 | 327/39 |
| 9,510,401 | B1 * | 11/2016 | Kost | H05B 45/3725 | |
| 2007/0159217 | A1 * | 7/2007 | Chan | H03K 17/223 | 327/77 |
| 2010/0117878 | A1 * | 5/2010 | Sheng | H03M 1/1014 | 341/120 |
| 2010/0321216 | A1 * | 12/2010 | Jonsson | H03M 5/02 | 341/61 |
| 2011/0291695 | A1 * | 12/2011 | Teng | G01R 31/40 | 324/764.01 |
| 2012/0022676 | A1 * | 1/2012 | Ishikawa | G10L 21/04 | 700/94 |
| 2012/0293144 | A1 * | 11/2012 | Chang | H02M 3/1588 | 323/271 |
| 2012/0310569 | A1 * | 12/2012 | Fan | G01R 23/15 | 702/70 |
| 2013/0163644 | A1 | 6/2013 | Haug et al. | | |
| 2018/0059154 | A1 | 3/2018 | Mecreant et al. | | |
| 2020/0400727 | A1 | 12/2020 | Parker et al. | | |

OTHER PUBLICATIONS

PCT Patent Application No. PCT/US2022/048893, International Search Report and Written Opinion, Mar. 9, 2023, 10 pages.

Salor et al., "Spectral Correction-based Method for Interharmonics Analysis of Power Signals With Fundamental Frequency Deviation", ScienceDirect, Electric Power Systems Research, vol. 79, No. 7, Jul. 2009, pp. 1025-1031.

Shabshab et al., "Voltage Waveform Transient Identification for Autonomous Load Coordination", IEEE Xplore, vol. 7, Aug. 28, 2019, pp. 123128-123137.

Shaw et al., "A Kalman-Filter Spectral Envelope Preprocessor", IEEE Xplore, vol. 56, No. 5, Sep. 17, 2007, pp. 2010-2017.

* cited by examiner

SAMPLING RATE CONVERTER WITH LINE FREQUENCY AND PHASE LOCKED LOOPS FOR ENERGY METERING

TECHNICAL FIELD

This invention relates generally to power signal processing and more specifically to sampling rate conversion techniques for energy metering.

BACKGROUND

Service providers utilize distributed networks to provide services to customers over large geographic areas. For example, power companies use power distribution lines to carry power from one or more generating stations (power plants) to residential and commercial customer sites. The generating stations use alternating current (AC) to transmit power over long distances via the power distribution lines. Long-distance transmission can be accomplished using a relatively high voltage. Substations located near the customer sites provide a step-down from the high voltage to a lower voltage (e.g., using transformers). Power distribution lines carry this lower-voltage AC from the substations to the endpoint devices customer sites.

Typically, electronic energy meters are installed at customer sites to monitor energy consumption by customers. Electronic energy meters track the amount of energy consumed by customers, typically measured in kilowatt-hours ("kWh"). The service provider uses the energy consumption information for billing and other purposes such as resource allocation forecasting.

Analog-to-digital converters (ADC) are typically used to convert analog signals coming from the power distribution lines to digital signals to be processed further. When the sampling rate of an ADC is not an integer multiple of the line frequency of the power distribution lines, the calculation of energy measurements becomes complicated because compensation for fractional portions is needed.

Additionally, even if the sampling rate of an ADC is designed to be an integer multiple of the line frequency, the line frequency may deviate from its nominal value. The line frequency is typically 60 Hz or 50 HZ, but it is not uncommon for the line frequency to deviate from the nominal line frequency. For instance, the allowable range for 60 Hz is ±0.5%, that is 59.7 Hz to 60.3 Hz. The line frequency jitter makes it even harder to have a sampling rate of an ADC that is an integer multiple of the line frequency.

Therefore, there is a need for resampling techniques that can facilitate simplified, accurate, and efficient energy measurements and are independent of ADC sampling rate and immune to the line frequency jitter.

SUMMARY

Certain aspects and features include a system and method for converting the sampling rate of a power signal.

In accordance with one aspect of the disclosure, a method of processing power signals is provided. The method includes the following operations: receiving an analog poly-phase signal associated with power delivered using alternating current (AC), the analog poly-phase signal having at least one current component and at least one voltage component comprising a reference voltage component; converting, using an analog to digital converter (ADC), the analog poly-phase signal to a digital poly-phase signal sampled at a first sampling rate; detecting a fundamental frequency of the analog poly-phase signal based on the digital poly-phase signal; determining a second sampling rate, wherein the second sampling rate is based on and tracks the fundamental frequency; resampling the digital poly-phase signal at the second sampling rate; for each cycle of the resampled digital poly-phase signal: transforming the resampled digital poly-phase digital signal to a frequency-domain signal using Fast Fourier Transformation (FFT); calculating a phase angle of the reference voltage component based on the frequency-domain signal; adjusting the resampled digital poly-phase signal by compensating the calculated phase angle; and transforming the adjusted resampled digital poly-phase signal to an updated frequency-domain signal using FFT; and calculating one or more measurements based on the updated frequency-domain signal.

In accordance with another aspect of the disclosure, a device connected to a power distribution network is provided. The device includes sensing circuitry configured to receive an analog poly-phase signal associated with power delivered using alternating current (AC) over the power distribution network, wherein the analog poly-phase signal having at least one current component and at least one voltage component comprising a reference voltage component; a processor configured to execute computer-readable instructions; and a memory configured to store the computer-readable instructions that, when executed by the processor, cause the processor to perform the following operations: converting, using an analog to digital converter (ADC), the analog poly-phase signal to a digital poly-phase signal sampled at a first sampling rate; detecting a fundamental frequency of the analog poly-phase signal based on the digital poly-phase signal; determining a second sampling rate, wherein the second sampling rate is based on and tracks the fundamental frequency; resampling the digital poly-phase signal at the second sampling rate; for each cycle of the resampled digital poly-phase signal: transforming the resampled digital poly-phase signal to a frequency-domain signal using Fast Fourier Transformation (FFT); calculating a phase angle of the reference voltage component based on the frequency-domain signal; adjusting the resampled digital poly-phase signal by compensating the calculated phase angle; and transforming the adjusted resampled digital poly-phase signal to an updated frequency-domain signal using FFT; and calculating one or more measurements based on the updated frequency-domain signal.

In accordance with yet another aspect of the disclosure, an electronic energy meter is provided. The electronic energy meter includes a sensor configured to receive an analog poly-phase signal associated with power delivered using alternating current (AC) over a power distribution network, the analog poly-phase signal having at least one current component and at least one voltage component comprising a reference voltage component; an analog to digital converter (ADC) configured to convert the analog poly-phase signal to a digital poly-phase signal sampled at a first sampling rate; and a power signal processing unit connected to the ADC. The power signal processing unit is configured to: detect a fundamental frequency of the analog poly-phase signal based on the digital poly-phase signal; determine a second sampling rate, wherein the second sampling rate is based on and tracks the fundamental frequency; resample the digital poly-phase signal at the second sampling rate; for each cycle of the resampled digital poly-phase signal: transform the resampled digital poly-phase signal to a frequency-domain signal using Fast Fourier Transformation (FFT); calculate a phase angle of the reference voltage component based on the frequency-domain signal; adjust the resampled digital poly-phase signal by compensating the calculated phase angle; and transform the adjusted resampled digital poly-phase signal to an updated frequency-domain signal using FFT; and calculate one or more measurements based on the updated frequency-domain signal.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Aspects of the present invention relate to sampling rate conversion techniques for energy metering. In accordance with some aspects of the disclosure, an analog poly-phase signal is received by an ADC, and the analog poly-phase signal has, for example, three voltage components (e.g., phase A line voltage, phase B line voltage, and phase C line voltage) and three current components (e.g., phase A line current, phase B line current, and phase C line current). Among the voltage components and the current components, the phase A line voltage is used as a reference (sometimes referred to as a "reference channel") in one implementation.

A fundamental frequency detector detects a fundamental frequency (i.e., the line frequency) of the analog poly-phase signal based on the sampled digital poly-phase signal. The output sampling rate of a sampling rate converter (also referred to as a "resampler") is then determined based on the fundamental frequency. The output sampling rate tracks the fundamental frequency such that the output sampling rate is independent of the ADC sampling rate and immune to the line frequency jitter. The sampling rate converter then resamples the digital poly-phase signal. In one implementation, the resampling operation is based on two signal processing operations, namely an interpolation operation and a decimation operation. During the interpolation operation, the sampling rate is up-converted to a higher sampling rate; during the decimation operation, the higher sampling rate is down-converted to the output sampling rate, which tracks the fundamental frequency, as mentioned above. In one example, the sampling rate converter is implemented by using a poly-phase resampler which includes a poly-phase filter bank. A Fast Fourier Transform (FFT) bank then transforms the resampled poly-phase digital signal to a frequency-domain signal. A metering measurement calculator calculates a phase angle of the reference voltage component (e.g., the phase A line voltage). The calculated phase angle is sent to the sampling rate converter as feedback, and the resampled digital poly-phase signal is adjusted based on the calculated phase angle. In one implementation, the zero-crossing of the reference voltage component is locked to the first sample for each cycle of the resampled digital signal. As such, there is a phase lock loop, and the resampled digital poly-phase signal is phase-locked. After the resampled digital poly-phase signal is phase-locked, the metering measurement calculator can calculate various measurements based on the frequency-domain signal. Details of the aspects mentioned above will be described below with reference to FIGS. 1-9. As will be explained below, the sampling rate conversion techniques can facilitate simplified, accurate, and efficient energy measurements and are independent of ADC sampling rate and immune to the line frequency jitter.

Figure 1:
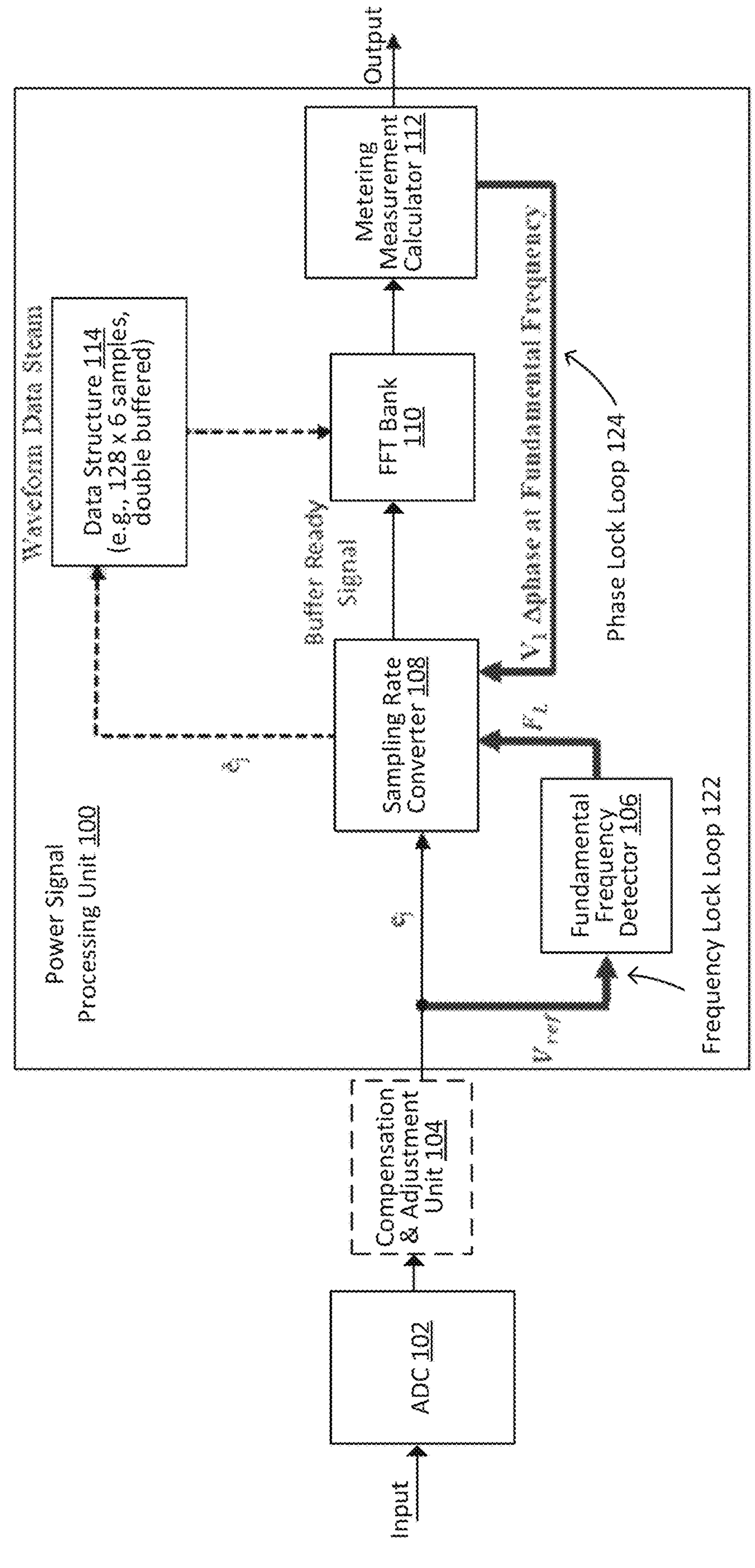
FIG. 1 is a diagram illustrating an example environment in which an example power signal processing unit operates.

FIG. 1 is a diagram illustrating an example environment in which an example power signal processing unit 100 operates. The power signal processing unit 100 is connected, either directly or indirectly, to an ADC 102, which receives an input signal, either directly or indirectly, from power distribution lines. In one implementation, the input signal is an analog poly-phase signal, and the ADC 102 converts the analog poly-phase signal to a digital poly-phase signal. In one example, the input signal is an analog three-phase signal. In another example, the input signal is an analog two-phase signal. Although the analog three-phase signal is used as an example throughout the disclosure, it is not intended to be limiting. In some implementations, a compensation and adjustment unit 104 is coupled between the ADC 102 and the power signal processing unit 100. The compensation and adjustment unit 104 is for calibration and temperature adjustment of the digital signal sampled by the ADC 102. The power signal processing unit 100 is configured to process the digital poly-phase signal received from the ADC 102 and output various metering measurements such as voltage, current, and/or energy measurements. In the example shown in FIG. 1, the power signal processing unit 100 includes, among other things, a fundamental frequency detector 106, a sampling rate converter 108, a Fast Fourier Transformation (FFT) bank 110, and a metering measurement calculator 112. It should be noted that the power signal processing unit 100 may also include other components in other implementations.

As mentioned above, the ADC 102 receives and converts the analog poly-phase signal to the digital poly-phase signal, which is sampled at a first sampling rate (also referred to as the "ADC sampling rate") $F_{ADC}$. In one implementation, the ADC 102 is connected to sensing circuitry, which is configured to receive the analog poly-phase signal k. In one implementation, the ADC 102 is connected to a sensor, which is configured to receive the analog poly-phase signal associated with power delivered using AC. As explained above, the analog poly-phase signal has at least one current component and at least one voltage component, one of which is a reference voltage component (e.g., phase A line voltage). In one example, the ADC sampling rate $F_{ADC}$ is 14648 Hz. Other ADC sampling rates may be employed in other examples.

The digital poly-phase signal is further fed to the fundamental frequency detector 106, which detects a fundamental frequency (i.e., the line frequency) $F_L$ of the analog poly-phase signal based on the converted digital poly-phase signal. In one implementation, the fundamental frequency detector 106 includes a band-pass filter and a zero-crossing detector, details of which will be described below with reference to FIGS. 3-7.

After the fundamental frequency $F_L$ is detected, the fundamental frequency $F_L$ is fed to the sampling rate converter 108, and a second sampling rate (also referred to as the "output sampling rate") $F_S$ is determined. The output sampling rate $F_S$ is based on and tracks the fundamental frequency $F_L$. When the fundamental frequency $F_L$ deviates from its nominal value, the output sampling rate $F_S$ adjusts proportionally. Thus, the output sampling rate $F_S$ is frequency-locked to the fundamental frequency $F_L$. In other words, the power signal processing unit 100 includes a frequency lock loop 122 as shown in FIG. 1. In one implementation, the output sampling rate $F_S$ is an integer multiple of the fundamental frequency $F_L$. Details of the output sampling rate $F_S$ will be described below.

The sampling rate converter 108 also receives the digital poly-phase signal output by the ADC 102 (after being processed by the compensation and adjustment unit 104 in some implementations). The sampling rate converter 108 then resamples the digital poly-phase signal at the output sampling rate $F_S$. Therefore, the digital poly-phase signal is converted from the ADC sampling rate $F_{ADC}$ to the output sampling rate $F_S$. The resampling ratio R is $F_S/F_{ADC}$. In one implementation, the resampling process carried out by the sampling rate converter 108 includes, among other operations, the interpolation (also referred to as "up-sampling") operation and the decimation (also referred to as "down-sampling") operation, as mentioned above. In one implementation, the resampling process carried out by the sampling rate converter 108 is by using a poly-phase resampler having a poly-phase filter bank. Details of the interpolation operation, the decimation operation, and the poly-phase resampler will be described below with reference to FIG. 8.

The FFT bank 110 receives and transforms the resampled digital poly-phase signal (after being buffered) to a frequency-domain signal using FFT. In one implementation, the FFT is performed in six channels (i.e., three voltage channels corresponding to three voltage components and three current channels corresponding to three current components) simultaneously. In one implementation, the FFT includes an N-point Discrete Fourier Transform (DFT). Details of the FFT bank and the transformation operations will be described below.

The metering measurement calculator 112 receives the frequency-domain signal and is capable of calculating voltage, current, and/or energy measurements such as DC voltage measurements, DC current measurements, fundamental RMS squared measurements, fundamental phase measurements, fundamental watt measurements, and the like. Among other things, a phase angle of the reference voltage component (e.g., the phase A line voltage) can be calculated. The resampled digital signal is then adjusted by compensating the calculated phase angle. In one implementation, the calculated phase angle is converted to a delta sample. After the adjustment using the calculated phase angle, the zero-crossing of the reference voltage component (e.g., the phase A line voltage) is phase-locked to a fixed location in the output sampling stream, while all other voltage components (e.g., the phase B line voltage and the phase C line voltage) and current components (e.g., the phase A line current, the phase B line current, and the phase C line current) are phase-adjusted along with the reference channel such that all channels are phase-locked together. As such, the power signal processing unit 100 has a phase lock loop 124 as shown in FIG. 1. In one implementation, the phase angle is calculated and used for adjusting the resampled digital poly-phase signal for each cycle of the resampled digital poly-phase signal.

Subsequently, the adjusted resampled digital poly-phase signal, after being phase-locked, is transformed to an updated frequency-domain signal by the FFT bank 110. Then, the metering measurement calculator 112 can calculate one or more measurements based on the updated frequency-domain signal. Details of the phase lock loop 124 will be described below.

Figure 2:
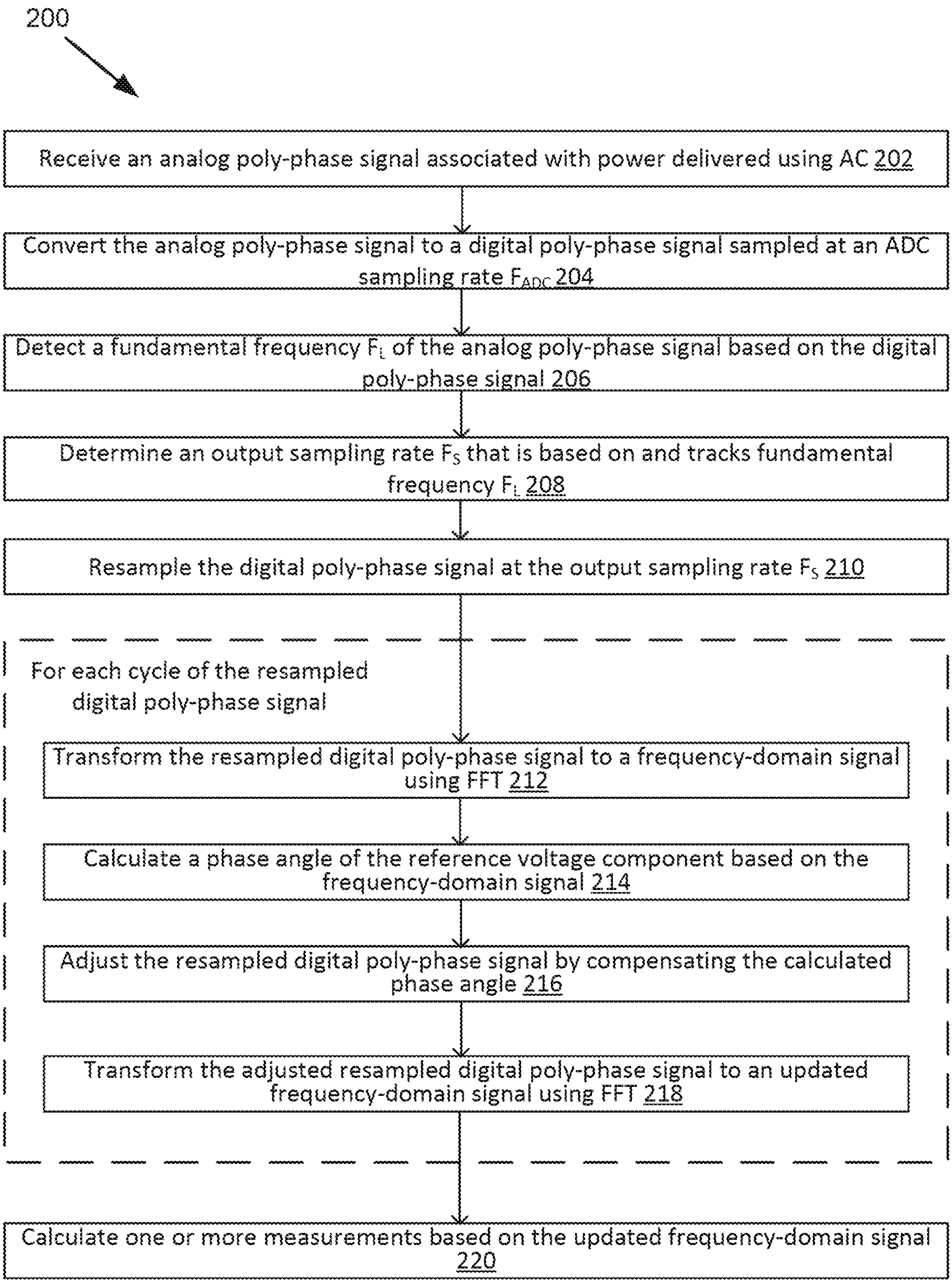
FIG. 2 is a flowchart diagram illustrating an example method of processing power signals.

FIG. 2 is a flowchart diagram illustrating an example method 200 of processing power signals. The example method 200 can be implemented based on, for example, the power signal processing unit 100 shown in FIG. 1. It should be understood that, in some implementations, one or more of the steps described in FIG. 2 may be performed in a different order. Additionally, in some implementations, a method may include more or fewer steps than are described in FIG. 2.

At step 202, an analog poly-phase signal associated with power delivered using AC is received. In some implementations, the analog poly-phase signal has multiple current components and multiple voltage components, one of which is a reference voltage component. At step 204, the analog poly-phase signal is converted to a digital poly-phase signal sampled at the ADC sample rate $F_{ADC}$ using the ADC 102.

At step 206, the fundamental frequency $F_L$ of the analog poly-phase signal is detected based on the digital poly-phase signal. Details of the detection of the fundamental frequency $F_L$ will be described below with reference to FIGS. 3-7. At step 208, the output sampling rate $F_S$ is determined. The output sampling rate FS is based on and tracks the fundamental frequency $F_L$.

At step 210, the digital poly-phase signal is resampled at the output sampling rate $F_S$. As mentioned above, the resampling operation may include the interpolation operation and the decimation operation in some implementations. In one implementation, the resampling process is implemented by using a poly-phase resampler having a poly-phase filter bank. Details of the interpolation operation, the decimation operation, and the poly-phase resampler will be described below with reference to FIG. 8.

For each cycle of the resampled digital poly-phase signal, the resampled digital poly-phase signal is transformed to a frequency-domain signal using FFT at step 212. In one implementation, the FFT includes an N-point Discrete Fourier Transform (DFT). Details of the FFT bank and the transformation operations will be described below. At step 214, a phase angle of the reference voltage component (e.g., the phase A line voltage) is calculated based on the frequency-domain signal. At step 216, the resampled digital poly-phase signal is then adjusted by compensating the calculated phase angle. In one implementation, the calculated phase angle is converted to a delta sample. After the adjustment using the calculated phase angle, the zero-crossing of the reference voltage component (e.g., the phase A line voltage) is phase-locked to a fixed location in the output sampling stream. At step 218, the adjusted resampled digital poly-phase signal, after being phase-locked, is transformed to an updated frequency-domain signal. Details of steps 212, 214, 216, and 218 will be described below.

At step 220, one or more measurements are calculated based on the updated frequency-domain signal. Details of step 220 will be described below.

Figure 3:
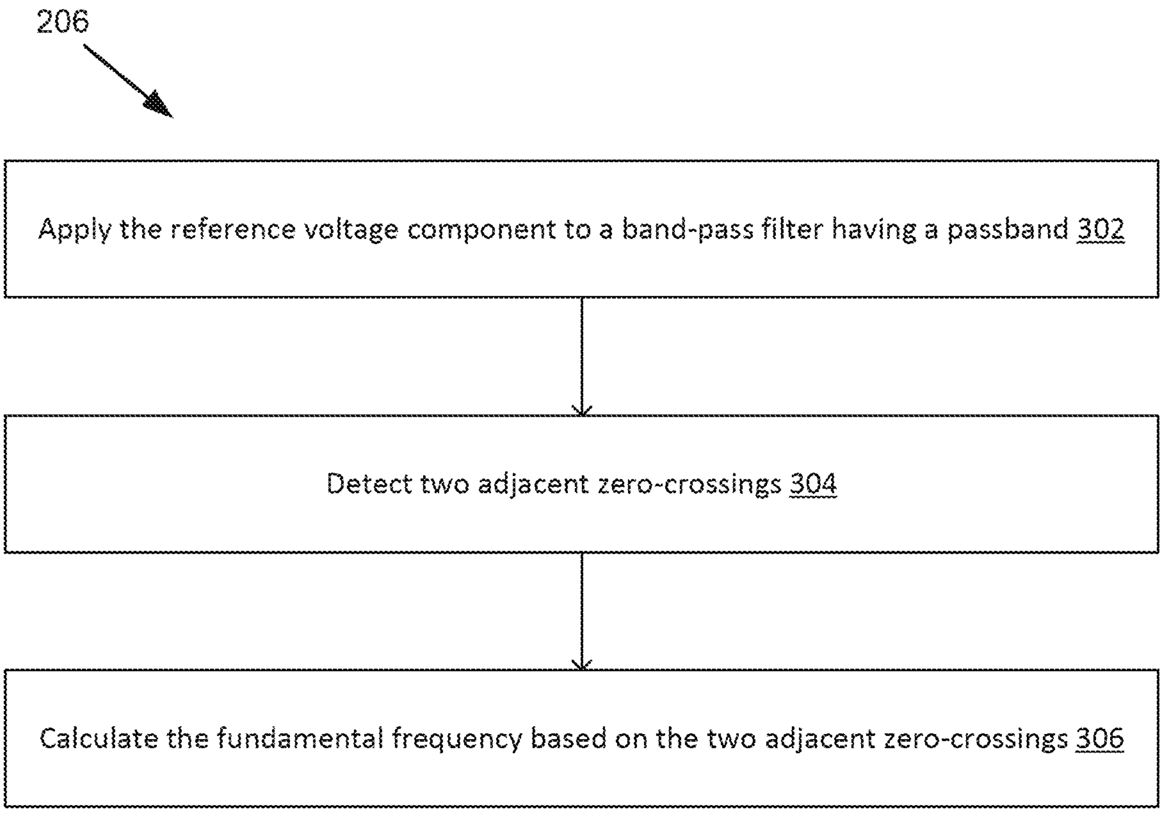
FIG. 3 is a flowchart diagram illustrating an example of the step 206 shown in FIG. 2.
Figure 4:
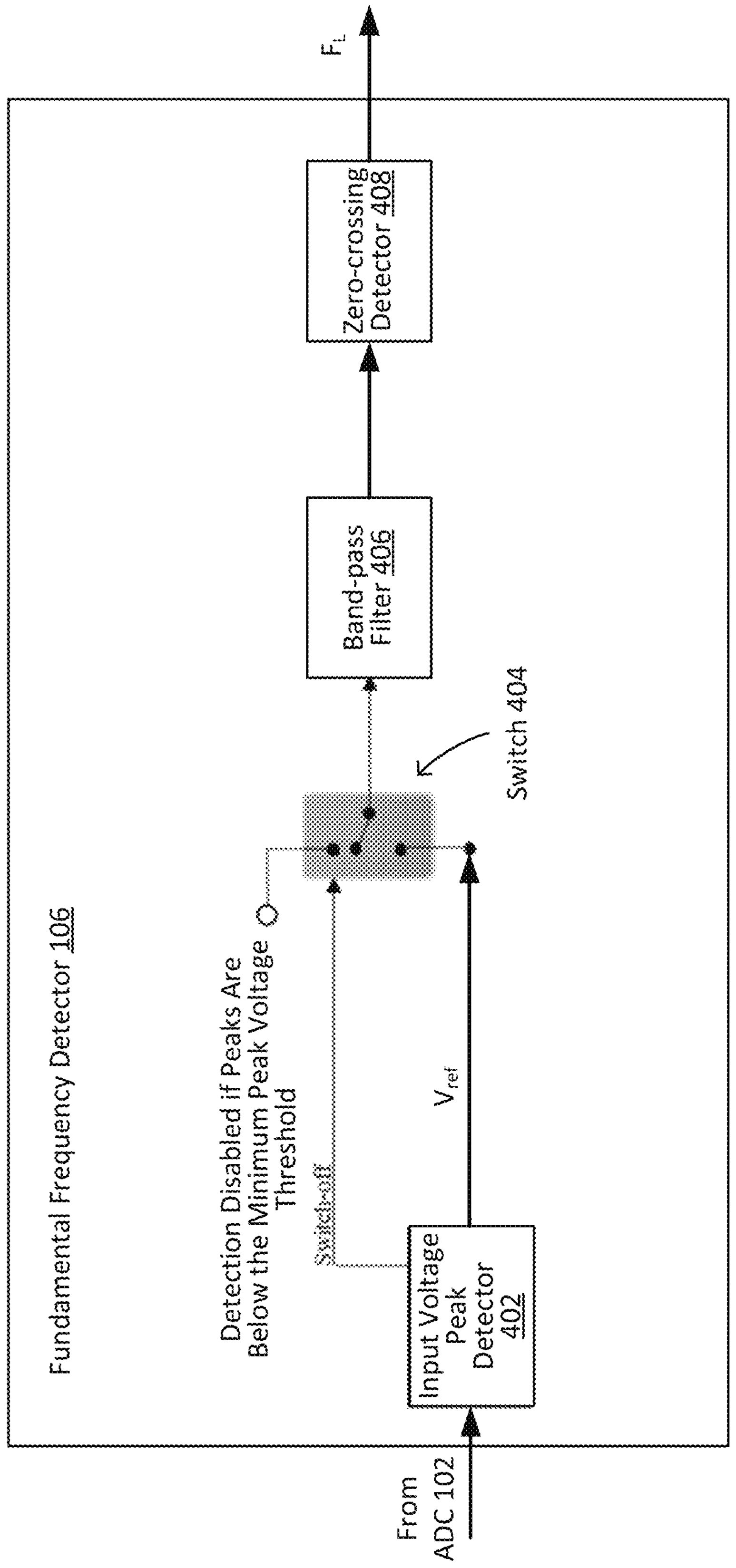
FIG. 4 is a diagram illustrating an example implementation of the fundamental frequency detector 106 shown in FIG. 1.

FIG. 3 is a flowchart diagram illustrating an example of step 206 shown in FIG. 2. FIG. 4 is a diagram illustrating an example implementation 400 of the fundamental frequency detector 106 shown in FIG. 1. In the example shown in FIG. 4, the fundamental frequency detector 106 includes, among other things, an input voltage peak detector 402, a switch 404, a band-pass filter 406, and a zero-crossing detector 408. The input voltage peak detector 402 receives the reference voltage component $V_{ref}$ (e.g., the phase A line voltage) from the ADC 102. The input voltage peak detector 402 detects peaks of the reference voltage component $V_{ref}$. When the peaks are below the minimum peak voltage threshold (indicating a poor quality), the switch 404 is turned off based on a switch-off signal generated by the input voltage peak detector 402, and the detection is turned off. As such, the detection of the fundamental frequency is disabled when the reference voltage component does not have good quality. Otherwise, the switch 404 is turned on, and the reference voltage component $V_{ref}$ is fed to the band-pass filter 406.

Figure 5A:
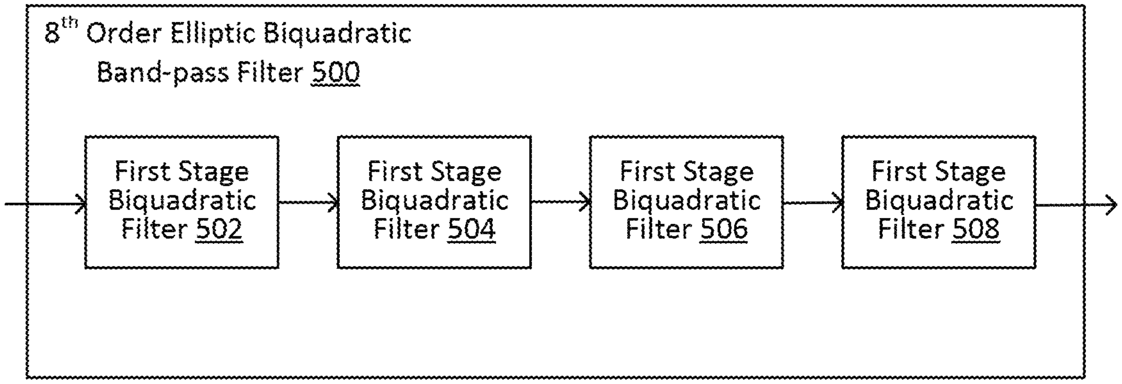
FIG. 5A is a diagram illustrating an example $8^{th}$ order elliptic biquadratic band-pass filter.
Figure 5B:
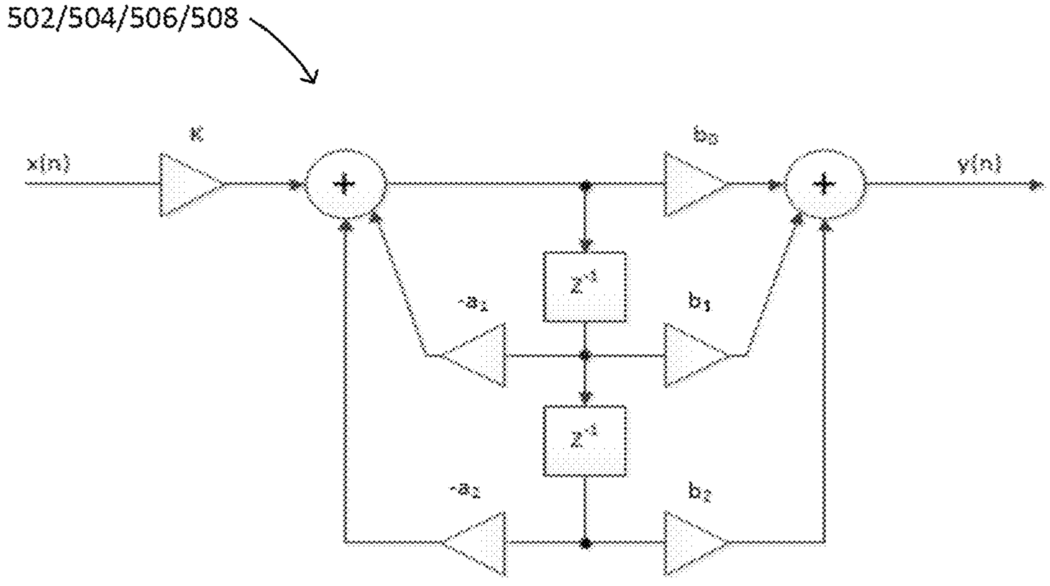
FIG. 5B is a diagram illustrating one biquadratic filter used in the example $8^{th}$ order elliptic biquadratic band-pass filter 500 shown in FIG. 5A.

Zero-crossing detection is very sensitive to noise and waveform distortions. Therefore, it is beneficial to apply the reference voltage component $V_{ref}$ to a band-pass filter before zero-crossing detection. In the example shown in FIG. 3, the reference voltage component $V_{ref}$ signal is applied to the band-pass filter 406 to remove frequency components outside the passband of the band-pass filter 406 (step 302 shown in FIG. 3). In one implementation, the band-pass filter 406 is an $8^{th}$ order elliptic biquadratic band-pass filter. FIG. 5A is a diagram illustrating an example $8^{th}$ order elliptic biquadratic band-pass filter 500. FIG. 5B is a diagram illustrating one biquadratic filter used in the example $8^{th}$ order elliptic biquadratic band-pass filter 500 shown in FIG. 5A. The $8^{th}$ order elliptic biquadratic band-pass filter 500 includes four biquadratic filters 502, 504, 506, and 508 in cascade. In other words, the output of the first stage biquadratic filter 502 becomes the input to the second stage biquadratic filter 504, the output of the second stage biquadratic filter 504 becomes the input to the third stage biquadratic filter 506, and so forth. For each of the four biquadratic filters 502, 504, 506, and 508, the difference equation has the following form:

$$y_n=-a_1y_{n-1}-a_2Y_{n-2}+b_0x_n+b_1x_{n-1}+b_2x_{n-2} \quad (1)$$

where: $a_1$ and $a_2$ are coefficients that determine the positions of the poles, and $b_0$, $b_1$, and $b_2$ are coefficients that determine zeros. In one example, the coefficients for each stage are shown in the table below.

TABLE 1

| Stage | Coefficients | | | | |
|---|---|---|---|---|---|
| | $a_1$ | $a_2$ | $b_0$ | $b_1$ | $b_2$ |
| 1 | −1.997533 | 0.9981368 | 1.0 | −1.9980394 | 1.0 |
| 2 | −1.997804 | 0.9983041 | 1.0 | −1.9998457 | 1.0 |
| 3 | −1.998588 | 0.9992704 | 1.0 | −1.9990246 | 1.0 |
| 4 | −1.9989693 | 0.9994122 | 1.0 | −1.9996899 | 1.0 |

Figure 6:
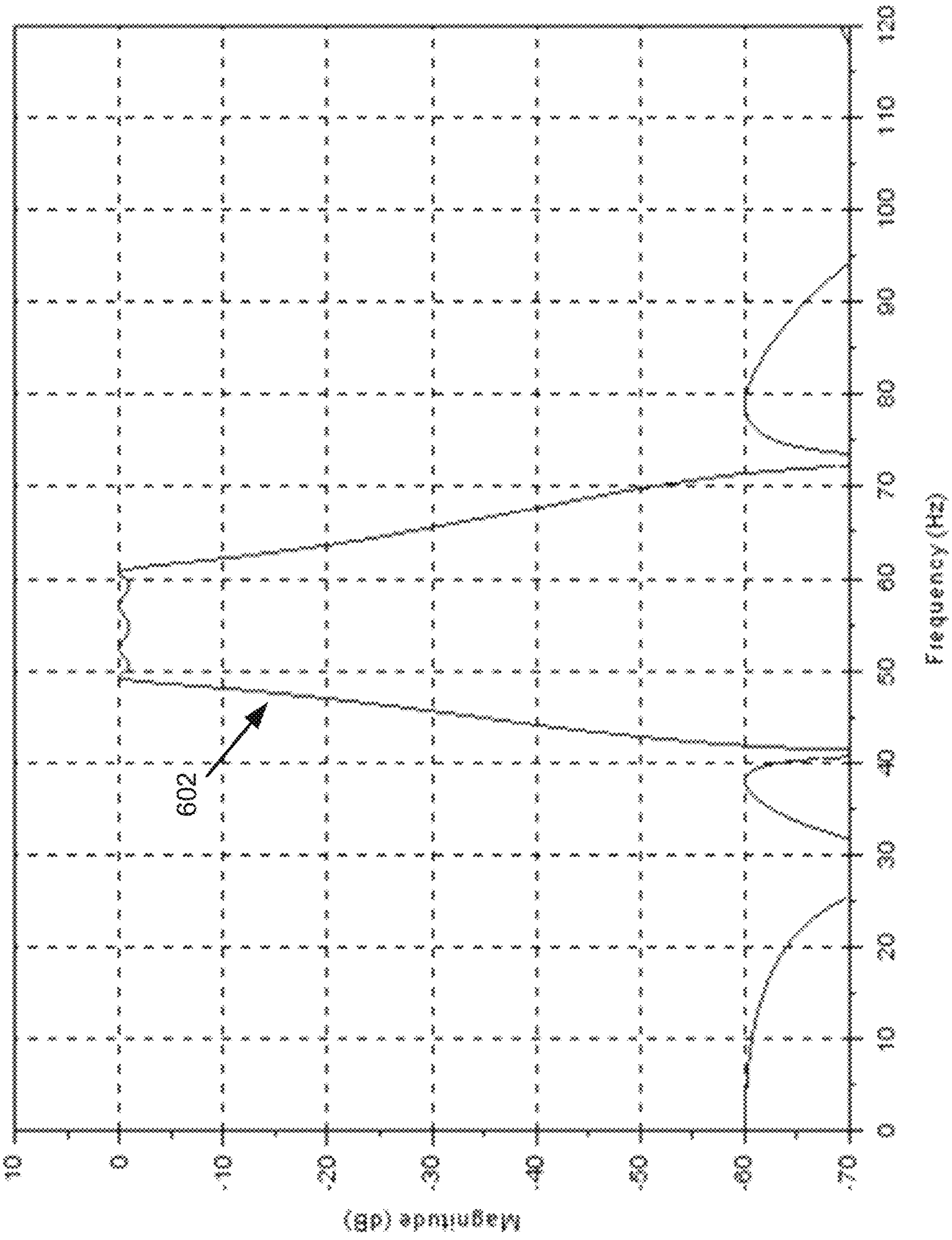
FIG. 6 is a diagram illustrating the frequency response of the $8^{th}$ order elliptic biquadratic band-pass filter 500 shown in FIG. 5A.

FIG. 6 is a diagram illustrating the frequency response 602 of the $8^{th}$ order elliptic biquadratic band-pass filter 500 shown in FIG. 5A. As shown in FIG. 6, the $8^{th}$ order elliptic biquadratic band-pass filter 500 is centered about 55 Hz, with a 3 dB bandwidth of 14 Hz. The $8^{th}$ order elliptic biquadratic band-pass filter 500 removes all integer multiples of 25 Hz and 30 Hz below 50 Hz or above 60 Hz. As such, the $8^{th}$ order elliptic biquadratic band-pass filter 500 reduces the noise bandwidth and eliminates all harmonic and inter-harmonic components, thereby producing a pure sinusoidal reference voltage component $V_{ref}$ signal, which is fed to the zero-crossing detector 408.

Figure 7:
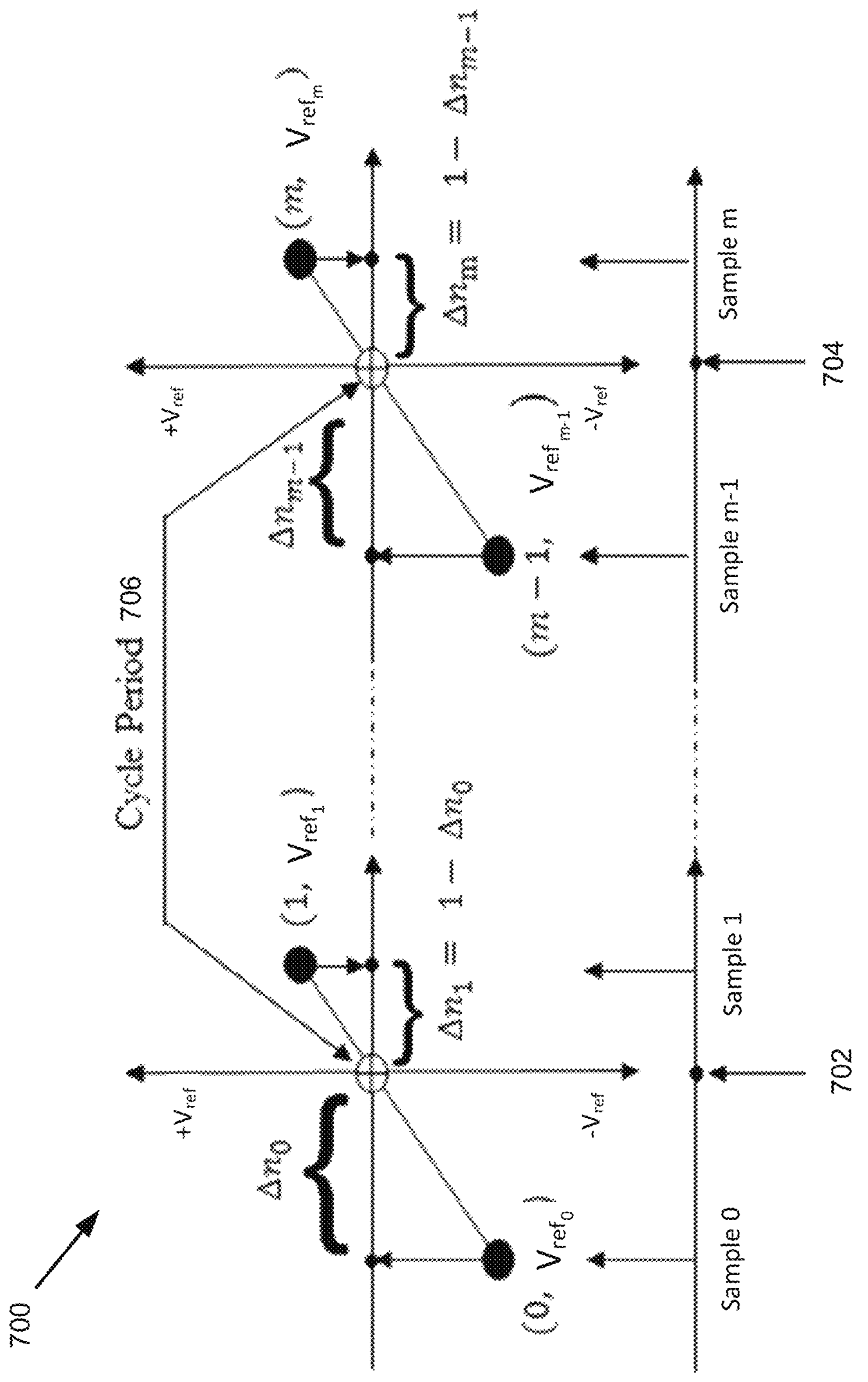
FIG. 7 is a diagram illustrating an example interpolation operation using the zero-crossing detector 408 shown in FIG. 4.

FIG. 7 is a diagram illustrating an example interpolation operation 700 using the zero-crossing detector 408 shown in FIG. 4. As shown in FIG. 7, a linear interpolation at the zero-crossings of the reference voltage component $V_{ref}$ signal is used to derive a very accurate measure of the cycle period. Two adjacent zero-crossings are detected (step 304 shown in FIG. 3). In the example shown in FIG. 7, there is a zero-crossing 702 between the Sample 0 and the Sample 1, and there is a zero-crossing 704 between the Sample m−1 and the Sample m. The sample counter is initialized to Ani and not incremented by one when the zero-crossing 702 is detected. At the next zero-crossing 704, the sample counter has increased by m−1 sample counts. $\Delta n_{m-1}$ and $\Delta n_1$ are added to the sample counter (i.e., m−1) to calculate the cycle period 706. Thus, the cycle period 706 in non-integer multiple of samples is in the following form:

$$N_c = m + (\Delta n_{m-1} + \Delta n_1) = m - \frac{u_{ref_{m-1}}}{u_{ref_m} - u_{ref_{m-1}}} + 1 + \frac{u_{ref_0}}{u_{ref_1} - u_{ref_0}} \quad (2)$$

Accordingly, the fundamental frequency $F_L$ can be calculated based on the two adjacent zero-crossings (step 306 shown in FIG. 3). The fundamental frequency $F_L$ is calculated as follows:

$$F_L = \frac{F_{ADC}}{N_c}. \quad (3)$$

Once the fundamental frequency $F_L$ is detected, the output sampling rate $F_S$ is determined (step 208 shown in FIG. 2). As explained above, the output sampling rate $F_S$ is frequency-locked to the fundamental frequency $F_L$. In one implementation, the fundamental frequency $F_L$ is the average $F_L$ over an instantaneous measurement interval (e.g., 100 milliseconds). The fundamental frequency $F_L$ is dynamically detected by the fundamental frequency detector 106, and using the average $F_L$ over an instantaneous measurement interval can cancel out random fluctuations.

In one implementation, the output sampling rate $F_S$ is an integer multiple of the fundamental frequency $F_L$. The output sampling rate $F_S$ is determined according to the following equation:

$$N\overline{F}_L=F_S. \quad (4)$$

where: N is an integer larger than one. In some implementations, N is a power of 2 (i.e., $2^m$). In one example, m=7, and the output sampling frequency is $128\overline{F}_L$.

A single line cycle is often not an integer multiple of samples, but a number of line cycles may be. Thus, in another implementation, an integer number of samples are specified over a specific number of line cycles. In one example, this condition is met in a 200 millisecond time span. This is accomplished by first finding a number of line cycles in the 200 milliseconds period: $N_{LC}$=round(0.2 $\overline{F}_L$). $N_{LC}$ is a maximum integer number of line cycles in a predetermined time period (e.g., 200 milliseconds). The actual delta time is $$\Delta t = \frac{N_{LC}}{F_L},$$

which resides in the interval between 0.1895 milliseconds and 0.2105 milliseconds, given that the line frequency is bounded by the interval between 45 Hz and 65 Hz. In one implementation, the output sampling rate $F_S$ can be set according to $$F_s = 2^m \frac{F_L}{N_{LC}}.$$

In one example, m is 10, and the output sampling rate $F_S$ is $$1024 * \frac{F_L}{N_{LC}}.$$

In another example, m is 11, and the output sampling rate $F_S$ is $$2048 * \frac{F_L}{N_{LC}}.$$

The digital poly-phase signal is then resampled at the output sampling rate $F_S$ (step 210 as shown in FIG. 2). As shown in FIG. 1, the sampling rate converter 108 resamples the digital poly-phase signal at the output sampling rate $F_S$, and the resampling ratio R is $F_S/F_{ADC}$. The sampling rate converter 108 changes the sampling rate of the digital signal while preserving, as closely as possible, the information contained in the digital poly-phase signal.

As explained above, the resampling process may be based on two operations, namely the interpolation operation and the decimation operation. The digital poly-phase signal is first up-sampled by a factor of L. L is an integer greater than one. The up-sampled digital poly-phase signal is then down-sampled by a factor of M. M is chosen according to $M=LF_{ADC}/F_S$. Therefore, after the interpolation operation and the decimation operation, the sampling rate of the digital poly-phase signal is the output sampling rate $F_S$.

In one implementation, the interpolation operation involves up-sampling by inserting L-1 zeros between two adjacent samples in the digital poly-phase signal and filtering out, using an image rejection filter, the images of the signal spectrum at integer multiples of the ADC sampling rate $F_{ADC}$. The images result from the sampling process conducted by the ADC 102. In one implementation, the decimation operation involves applying an anti-aliasing filter to the sample stream to prevent aliasing, followed by selecting every $M^{th}$ sample. Both the image rejection filter and the anti-aliasing filter are low-pass filters and can be implemented as finite impulse response (FIR) filters. Each of them can be designed at the up-sampling frequency $LF_{ADC}$. In one implementation, they can be combined by convolving the two impulse responses together. In one example, the sampling rate converter 108 has one primary 256-tap FIR filter for the interpolation operation and the decimation operation. In one example, the FIR filter used has 0.02 dB of ripple in its passband and contributes virtually no distortion across the spectrum of the digital poly-phase signal. In addition, since the FIR filter (with symmetric kernels) is a linear-phase filter across the spectrum, it attributes no distortion to the phase of the digital poly-phase signal.

As explained above, the up-sampled digital poly-phase signal is then down-sampled by a factor of M. M is chosen according to $M=LF_{ADC}/F_S$. In general, M is a floating-point number. Decimation by a non-integer number is challenging because a sample out of the decimator does not necessarily come out at a fixed number of cycles of the ADC clock.

In the process described above, a convolution of the image rejection filter with the up-sampled digital poly-phase signal is needed. However, only a small portion of the convolution is performed on non-zero samples. Due to the nature of the interpolation operation, only one sample out of every L samples is actually multiplied with a filter coefficient. For example, for a 256-tap image rejection filter, 248 filter coefficients are multiplied with zeros, and only eight filter coefficients are multiplied with non-zero values. Performing convolutions on mostly zeros can be improved to increase efficiency. Also, the sum of the multiplication results is further convolved with the anti-aliasing filter, and the result is further decimated. In other words, many samples are convolved but eventually thrown away in the subsequent decimation operation.

Figure 8:
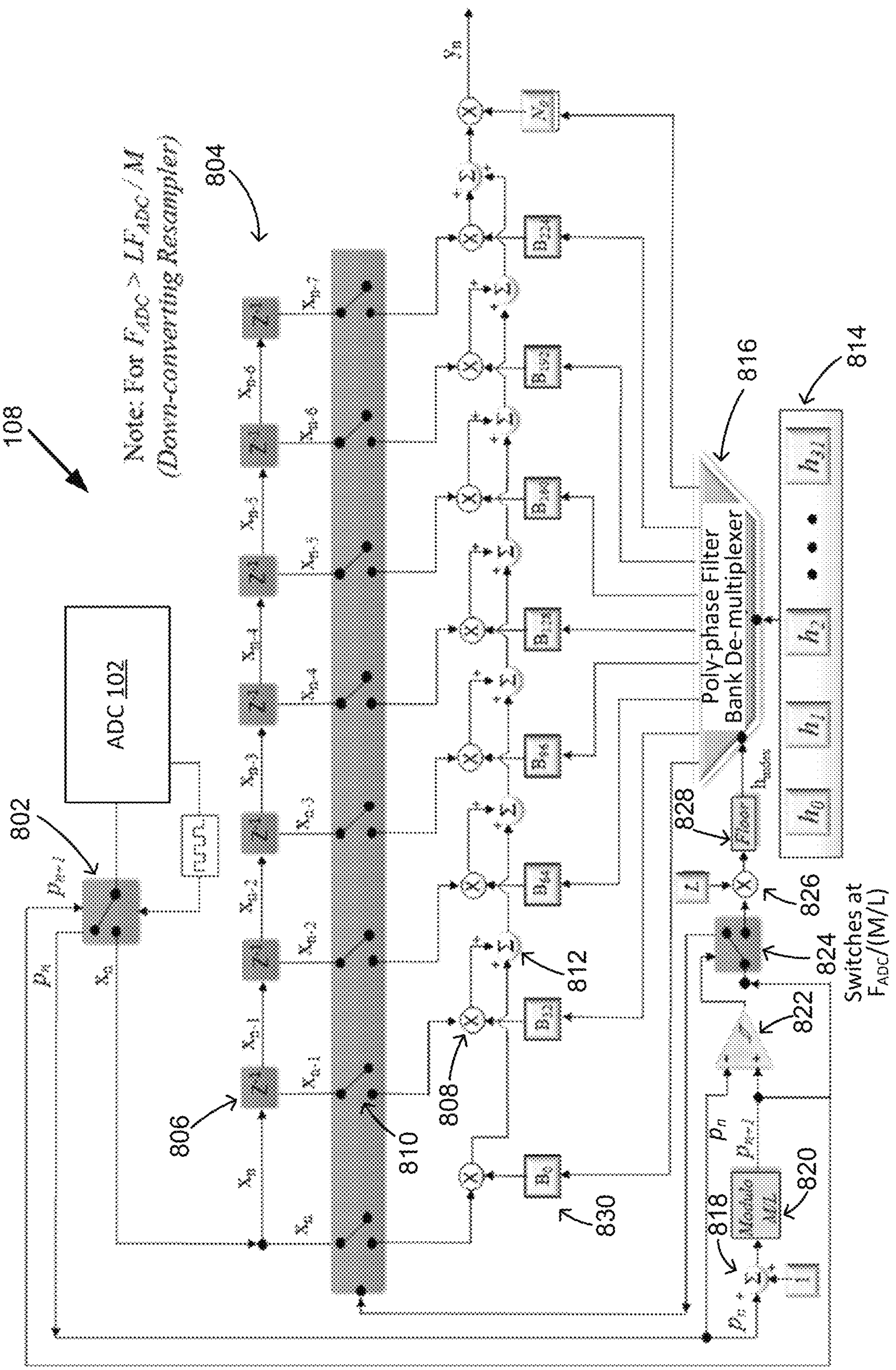
FIG. 8 is a diagram illustrating an example sampling rate converter 108 shown in FIG. 1.

Therefore, in another implementation, a poly-phase resampler having a poly-phase filter bank is used to address the above-mentioned challenges of decimation by a non-integer number and provides further efficiency improvement. FIG. 8 is a diagram illustrating an example sampling rate converter 108 shown in FIG. 1. The sampling rate converter 108 includes, among other things, a delay line 804, a poly-phase filter bank 814, and a poly-phase filter bank de-multiplexer 816. The sampling rate converter 108 receives the digital poly-phase signal from the ADC 102.

The above-mentioned image rejection filter and the anti-aliasing filter are combined into one filter since they are in cascade. A bank of L sub-filters are created from the original FIR filter. In the example of 256-tap FIR filter, when L is 32, 32 sub-filters are created, and each sub-filter has eight taps. In the example shown in FIG. 8, the bank of 32 sub-filters is designated as the poly-phase filter bank 814. Since interpolation filtering uses every $32^{nd}$ filter coefficient in the convolution to produce a single sample in the up-sampled sample stream. That is, only eight taps are needed for any sample instance. Thus, the poly-phase filter bank 814 is in the following form:

$$h_0=(B_0,B_{32},B_{64},B_{96},B_{128},B_{160},B_{192},B_{224})$$

$$h_1=(B_1,B_{33},B_{65},B_{97},B_{129},B_{161},B_{193},B_{225})$$

$$h_2=(B_2,B_{34},B_{66},B_{98},B_{130},B_{162},B_{194},B_{226})$$

$$\ldots$$

$$h_{31}=(B_{31},B_{63},B_{95},B_{127},B_{159},B_{191},B_{223},B_{255}). \quad (5)$$

It should be noted that the original FIR filter is unity gain at the interpolation rate $LF_{ADC}$. The condition for the original FIR filter to be unity gain is defined as:

$$\sum_{i=0}^{255} B_i = 1.$$

When a sub-filter is applied, it also needs to hold to this condition in order to properly scale the output sample, i.e., to keep the amplitude of the output signal at unity gain. Therefore, each sub-filter $h_i$ needs to be normalized by the inverse of the sum of its coefficients as follows:

$$N_k = \frac{1}{\sum_{i=0}^{7} h_k(i)}.$$

Each sub-filter $h_i$, in the poly-phase filter bank 814, is offset in time with respect to the interpolation rate $LF_{ADC}$, by $\frac{i}{LF_{ADC}}$, i=0, . . . , 31. There are L (32 in this example) interpolated samples per ADC sample. Each $h_i$ represents the interpolation function for a particular time (also a particular phase) of the interpolated waveform.

The delay line 804 includes seven delay line shift register 806. A sample $x_n$ is clocked out of the ADC 102 and into the delay line 804. A new sample is shifted onto the delay line 804 and the oldest sample is shift off. In the example shown in FIG. 8, the delay line 804 has a constraint length of 8, corresponding to eight taps, though other constraint lengths could be employed in other examples. As such, eight samples $x_n$, $x_{n-1}$, $x_{n-2}$, $x_{n-3}$, $x_{n-4}$, $x_{n-5}$, and $x_{n-6}$ are fed to eight multipliers 808, respectively.

The delay line 804 is clocked at the ADC sampling rate $F_{ADC}$, and the output commutator 824 is clocked at the output sampling rate $$F_{ADC}/\left(\frac{M}{L}\right) = F_s.$$

No part of the sampling rate converter 108 is clocked at the interpolated rate of $LF_{ADC}$. In the example shown in FIG. 8, it should be noted that the output sampling rate $F_S$ is lower than the ADC sampling rate $F_{ADC}$.

In addition, the decimation phase $p_n$ is also clocked with each ADC sample (i.e., at the ADC sampling rate $F_{ADC}$). For every ADC clock cycle, $p_n$ is incremented by 1 modulo M/L (i.e., the re-sampling factor) using the adder 818 and the modulo operator 820, and $p_n+1$ is generated.

As explained above, M/L is often a floating-point number. In one example, $M/L=F_{ADC}/(128*F_L)$, let $F_L=50.1$ Hz, $F_{ADC}=14648$ Hz, then M/L=2.436533. Accordingly, $p_n+i$ can be calculated according to: $p_n+1=\text{Mod}_{M/L}\ (p_n+1)=\text{Mod}_{2.436533}\ (p_n+1)$.

Subsequently, $p_n$ and $p_{n+1}$ enter a comparator 822. If $p_{n+1}<p_n$, the decimation phase has wrapped, and it's time to output a sample (i.e., the switch 824 is closed). The switch 824 switches at the rate of $F_{ADC}/(M/L)$. The decimation phase at this instance is smaller than 1. The decimation phase $p_{n+1}$ explicitly contains the information on which sub-filter $h_i$ is to be selected from the poly-phase filter bank 814. By multiplying $p_{n+1}$ by L and taking the floor, using the multiplier 826 and the floor operator 828, respectively, the sub-filter index $h_{index}$ is determined.

The sub-filter index $h_{index}$ is an input into the poly-phase filter bank de-multiplexer 816, which shifts the sub-filter coefficients into the coefficient registers 830. In the example shown in FIG. 8, the poly-phase filter de-multiplexer 816 has shifted $h_0=(B_0, B_{32}, B_{64}, B_{96}, B_{128}, B_{160}, B_{192}, B_{224})$ into the coefficient registers 830 in eight taps, respectively, along with the normalizer No.

The comparator 822 also causes the switch 824 to close so that the multiply accumulation is performed on the delay line 804 and the coefficient registers 830. The results of eight taps are added by the adders 812 before being multiplied by the normalizer No to keep the output at unity gain. The falling edge of the current ADC clock opens the switches 824 for the multiplier 826, the floor operator 828, and the poly-phase filter bank 814.

The resampled digital poly-phase signal is transformed to a frequency-domain signal using FFT (step 212 shown in FIG. 2). The FFT bank 110 receives and transforms the resampled digital poly-phase signal to a frequency-domain signal using FFT. FFT is an algorithm for computing the N-point DFT with a computational complexity of $O(N_D \log N_D)$, where $N_D$ is the data size. In one implementation, the FFT is performed in six channels (i.e., three voltage channels corresponding to three voltage components and three current channels corresponding to three current components) simultaneously. In one implementation, the FFT includes an N-point Discrete Fourier Transform (DFT). In one example, the N-point DFT is a 128-point DFT.

In one implementation, a real FFT algorithm can be employed, where a real time-domain signal $\{x_0, x_1, x_2, \ldots, x_{n-1}\}$ of length $2^m$ (in some examples, m=7, 10, or 11), and is transformed to the frequency domain $\{X_{-k/2}, X_{-k/2+1}, X_{-k/2+2}, \ldots, X_0, X_1, \ldots, X_{k/2-1}\}$ which has the same length as time-domain sequence {x}. The value of each element of {X} is a complex number. In other words, real data goes in and complex data comes out of the real FFT algorithm. The signal x(n) is sampled at the ADC sampling rate $F_{ADC}$, and the time represented by each index n in x(n) is $n/F_{ADC}$. On the other hand, the index n of the sequence{X} represents a set of frequencies, $kF_{ADC}/2^m$. It should be noted that there are negative indices for the frequency domain sequence {X}. These are complex images of the positive frequency axis. For a real FFT algorithm, only half of the data is unique. Therefore, only half of the data is used.

In one example, the output sampling rate $F_S$ is $128*F_L$. If a 128-point real FFT is performed on a time-domain sequence with this output sampling rate $F_S$, every frequency component of the real FFT is a harmonic of the fundamental frequency $F_L$.

The real FFT algorithm integrates over time, but correlates x(n) during this integration with a particular frequency as follows:

$$X_k = \frac{2}{N\sqrt{2}}\sum_{n=0}^{N-1} x_n e^{-\frac{i2\pi(kn)}{N}} = \frac{2}{N\sqrt{2}}\sum_{n=0}^{N-1} x_n\left[\cos\frac{2\pi(kn)}{N} - i\sin\frac{2\pi(kn)}{N}\right]. \tag{6}$$

Conventionally, the output of the FFT is scaled by 1/N, however, the results of the real FFT are split between two images, each with half of the total magnitude. Since the output of the real FFT contains N/2 components, it doesn't produce the redundant image out of efficiency. Therefore, it needs to be scaled by 2/N, to account for the missing half. Also, the magnitudes at each frequency bin are in peak magnitudes. To convert the magnitude of each component to RMS, it is scaled by $1/\sqrt{2}$. Therefore, the real FFT scaling used is $$\frac{2}{N\sqrt{2}}.$$

The time-domain data out of the ADC 102 that has been ordered into a six-dimensional vector (corresponding to six channels) as follows:

$$e_j \equiv (u_k, i_k) \equiv (u_1, u_2, u_3, i_1, i_2, i_3), j=1,2,3, \ldots, 6 \text{ and } k=1, \ldots, 3 \quad (7)$$

where: $u_k$≡(Phase-A voltage, Phase-B voltage, Phase-C voltage), and $i_k$≡(Phase-A current, Phase-B current, Phase-C current). The Fourier transform of a buffer of length $2^m$ of $e_j$ is as follows:

$$\mathcal{F}(B_{2^m}(e)) = E_j \equiv (U_k, I_k) \quad (8)$$

This can be shown in the table below as follows:

TABLE 2

| Channel/ Freq. Bin | Phase-A Voltage | Phase-B Voltage | Phase-C Voltage | Phase-A Current | Phase-B Current | Phase-C Current |
|---|---|---|---|---|---|---|
| 0 | $E_1(0)$ ∥ $U_1(0)$ | $E_2(0)$ ∥ $U_2(0)$ | $E_3(0)$ ∥ $U_3(0)$ | $E_4(0)$ ∥ $I_1(0)$ | $E_5(0)$ ∥ $I_2(0)$ | $E_6(0)$ ∥ $I_3(0)$ |
| 1 | $E_1(1)$ ∥ $U_1(1)$ | $E_2(1)$ ∥ $U_2(1)$ | $E_3(1)$ ∥ $U_3(1)$ | $E_4(1)$ ∥ $I_1(1)$ | $E_5(1)$ ∥ $I_2(1)$ | $E_6(1)$ ∥ $I_3(1)$ |
| 2 | $E_1(2)$ ∥ $U_1(2)$ | $E_2(2)$ ∥ $U_2(2)$ | $E_3(2)$ ∥ $U_3(2)$ | $E_4(2)$ ∥ $I_1(2)$ | $E_5(2)$ ∥ $I_2(2)$ | $E_6(2)$ ∥ $I_3(2)$ |
| 3 | $E_1(3)$ ∥ $U_1(3)$ | $E_2(3)$ ∥ $U_2(3)$ | $E_3(3)$ ∥ $U_3(3)$ | $E_4(3)$ ∥ $I_1(3)$ | $E_5(3)$ ∥ $I_2(3)$ | $E_6(3)$ ∥ $I_3(3)$ |
| . . . | | | | | | |
| $2^{m-1}-1$ | $E_1(2^{m-1}-1)$ or $U_1(2^{m-1}-1)$ | $E_2(2^{m-1}-1)$ or $U_2(2^{m-1}-1)$ | $E_3(2^{m-1}-1)$ or $U_3(2^{m-1}-1)$ | $E_4(2^{m-1}-1)$ or $I_1(2^{m-1}-1)$ | $E_5(2^{m-1}-1)$ or $I_2(2^{m-1}-1)$ | $E_6(2^{m-1}-1)$ or $I_3(2^{m-1}-1)$ |

In one implementation, these 6 Fourier transforms shown in Table 2 are performed within high-performance real-time engine 32-bit microcontrollers such as RX71M. It should be understood that this is not intended to be limiting.

Once the frequency-domain signal is obtained, phase angles between the reference voltage component and other components are calculated based on the frequency-domain signal. Various instantaneous measurements made by the electronic energy meter can be derived by the following operation:

$$M_{ij} = E_i E_j^* \quad (9)$$

This represents the complex outer product of E with its complex conjugate. This outer product yields a 6×6 matrix with elements each having $2^{m-1}$ frequency components. This is a symmetric matrix, so half of the components are redundant. Various measurements, including (fundamental) phase angles, made by the electronic energy meter can be derived from this matrix. Phase angles between the reference voltage component (e.g., the phase A line voltage) and other components can be calculated as follows:

$$\begin{aligned}
\text{angle}(u_{phB}, u_{phA}) &= \tan^{-1} im(U_2(1)U_1^*(1))/re(U_2(1)U_1^*(1)) && [B/A \text{ Voltage}] \\
\text{angle}(u_{phC}, u_{phA}) &= \tan^{-1} im(U_3(1)U_1^*(1))/re(U_3(1)U_1^*(1)) && [C/A \text{ Voltage}] \\
\text{angle}(u_{phA}, i_{phA}) &= \tan^{-1} im(U_1(1)I_1^*(1))/re(U_1(1)I_1^*(1)) && [A \text{ Voltage/Current}] \\
\text{angle}(u_{phB}, i_{phB}) &= \tan^{-1} im(U_2(1)I_2^*(1))/re(U_2(1)I_2^*(1)) && [B \text{ Voltage/Current}] \\
\text{angle}(u_{phC}, i_{phC}) &= \tan^{-1} im(U_3(1)I_3^*(1))/re(U_3(1)I_3^*(1)) && [C \text{ Voltage/Current}]
\end{aligned} \quad (10)$$

The phase angle of the reference voltage component is, therefore, calculated based on the frequency-domain signal (step 214 shown in FIG. 2). The resampled digital poly-phase signal is then adjusted by compensating the calculated phase angle (step 216 shown in FIG. 2). The waveform data stream out of the sampling rate converter 108 is buffered into a data structure 114 that includes 128 samples for each channel, as shown in FIG. 1. There are six channels, corresponding to three voltage components and three current components, in the example shown in FIG. 1. Sample-0 is the oldest, and Sample-127 is the newest sample in time. It is desirable to lock the zero-crossing of the reference voltage component (phase A line voltage in this example) to Sample-0 within this waveform data stream.

The phase lock loop 124 is implemented after Sample-127 enters the waveform data stream. In one implementation, the calculated phase angle is converted to a delta sample Δn by multiplying the phase angle by 128/2π. At this point, the interpolation sample phase $P_n$ is adjusted by this delta sample according to the following:

$$P_n = \begin{cases} P_n - 1, & \Delta n > 1 \\ P_n + 1, & \Delta n < -1 \\ P_n + \Delta n, & \text{otherwise} \end{cases} \quad (11)$$

When the delta sample Δn ranges from −1 to 1, the interpolation sample phase $P_n$ is adjusted by the calculated delta sample Δn; otherwise, the interpolation sample phase $P_n$ is adjusted by one sample instead of the calculated delta sample Δn. As such, the adjustment to $P_n$ is by no more than one sample in the positive or negative direction in any event to avoid a huge jump in the waveform.

The adjusted resampled digital poly-phase signal is transformed to an updated frequency-domain signal using FFT (step 218 shown in FIG. 2). After the adjustment using the calculated phase angle, the zero-crossing of the reference voltage component is phase-locked to a fixed location in the output sampling stream, while all other components are phase-adjusted along with the reference voltage component such that all components are phase-locked together. In one implementation, the phase angles are adjusted for each cycle of the resampled digital poly-phase signal.

The metering measurement calculator 112 calculates one or more measurements based on the updated frequency-domain signal (step 220 shown in FIG. 2). As explained above, various measurements made by the electronic energy meter can be derived from the matrix $M_{ij}$.

Some exemplary measurements made by the electronic energy meter are illustrated below. It should be noted that the calculation of other measurements using the matrix $M_{ij}$ is within the scope of the disclosure.

The DC measurements are bin 0 of the FFT set $E_j(0)$. The DC voltages and currents for phase A, phase B, and phase C are as follows:

$$u_{1_{DC}}=E_1(0)A \text{ voltage}$$

$$u_{2_{DC}}=E_2(0)B \text{ voltage}$$

$$u_{3_{DC}}=E_3(0)C \text{ voltage} \tag{12}$$

$$i_{1_{DC}}=E_4(0)A \text{ current}$$

$$i_{2_{DC}}=E_5(0)B \text{ current}$$

$$i_{3_{DC}}=E_6(0)C \text{ current}$$

The fundamental measurements are all contained within bin 1 of the FFT measurement matrix:

$$M_{ij}(1)=E_i(1)E_j^*(1).$$

It should be noted that each of the voltages and currents for phase A, phase B, and phase C has its real component and imaginary component in the following form:

$$U_k=U_{(r)k}+jU_{(i)k} \tag{13}$$

$$I_k=I_{(r)k}+I_{(i)k}$$

For instance, the RMS squared of the fundamental components of the voltages and currents are calculated according to:

$$Fu_{rms1}^2=E_1(1)E_1^*(1)=U_1(1)U_1^*(1)=U_{r1}(1)U_{r1}(1)+U_{i1}(1)U_{i1}(1) \tag{14}$$

$$Fu_{rms2}^2=E_2(1)E_2^*(1)=U_2(1)U_2^*(1)=U_{r2}(1)U_{r2}(1)+U_{i2}(1)U_{i2}(1)$$

$$Fu_{rms3}^2=E_3(1)E_3^*(1)=U_3(1)U_3^*(1)=U_{r3}(1)U_{r3}(1)+U_{i3}(1)U_{i3}(1)$$

$$Fi_{rms1}^2=E_4(1)E_4^*(1)=I_1(1)I_1^*(1))=I_{r1}(1)I_{r1}(1)+I_{i1}(1)I_{i1}(1)$$

$$Fi_{rms2}^2=E_5(1)E_5^*(1)=I_2(1)I_2^*(1))=I_{r2}(1)I_{r2}(1)+I_{i2}(1)I_{i2}(1)$$

$$Fi_{rms3}^2=E_6(1)E_6^*(1)=I_3(1)I_3^*(1)=I_{r3}(1)I_{r3}(1)+I_{i3}(1)I_{i3}(1)$$

By way of example, the fundamental Watt measurements is computed according to:

$$FWatt_1=re(E_1(1)E_4^*(1))=U_{r1}(1)I_{r1}(1)+U_{i1}(1)I_{i1}(1)\quad[\text{Phase-A}] \tag{15}$$

$$FWatt_2=re(E_2(1)E_5^*(1))=U_{r2}(1)I_{r2}(1)+U_{i2}(1)I_{i2}(1)\quad[\text{Phase-B}]$$

$$FWatt_3=re(E_3(1)E_6^*(1))=U_{r3}(1)I_{r3}(1)+U_{i3}(1)I_{i3}(1)\quad[\text{Phase-C}]$$

In another example, the fundamental reactive power is calculated according to:

$$FVAR_1=im(E_1(1)E_4^*(1))=U_{i1}(1)I_{r1}(1)-U_{r1}(1)I_{i1}(1)\quad[\text{Phase-A}] \tag{16}$$

$$FVAR_2=im(E_2(1)E_5^*(1))=U_{i2}(1)I_{r2}(1)-U_{r2}(1)I_{i2}(1)\quad[\text{Phase-B}]$$

$$FVAR_3=im(E_3(1)E_6^*(1))=U_{i3}(1)I_{r3}(1)-U_{r3}(1)I_{i3}(1)\quad[\text{Phase-C}]$$

Example of a Computing System in Some Implementations

Figure 9:
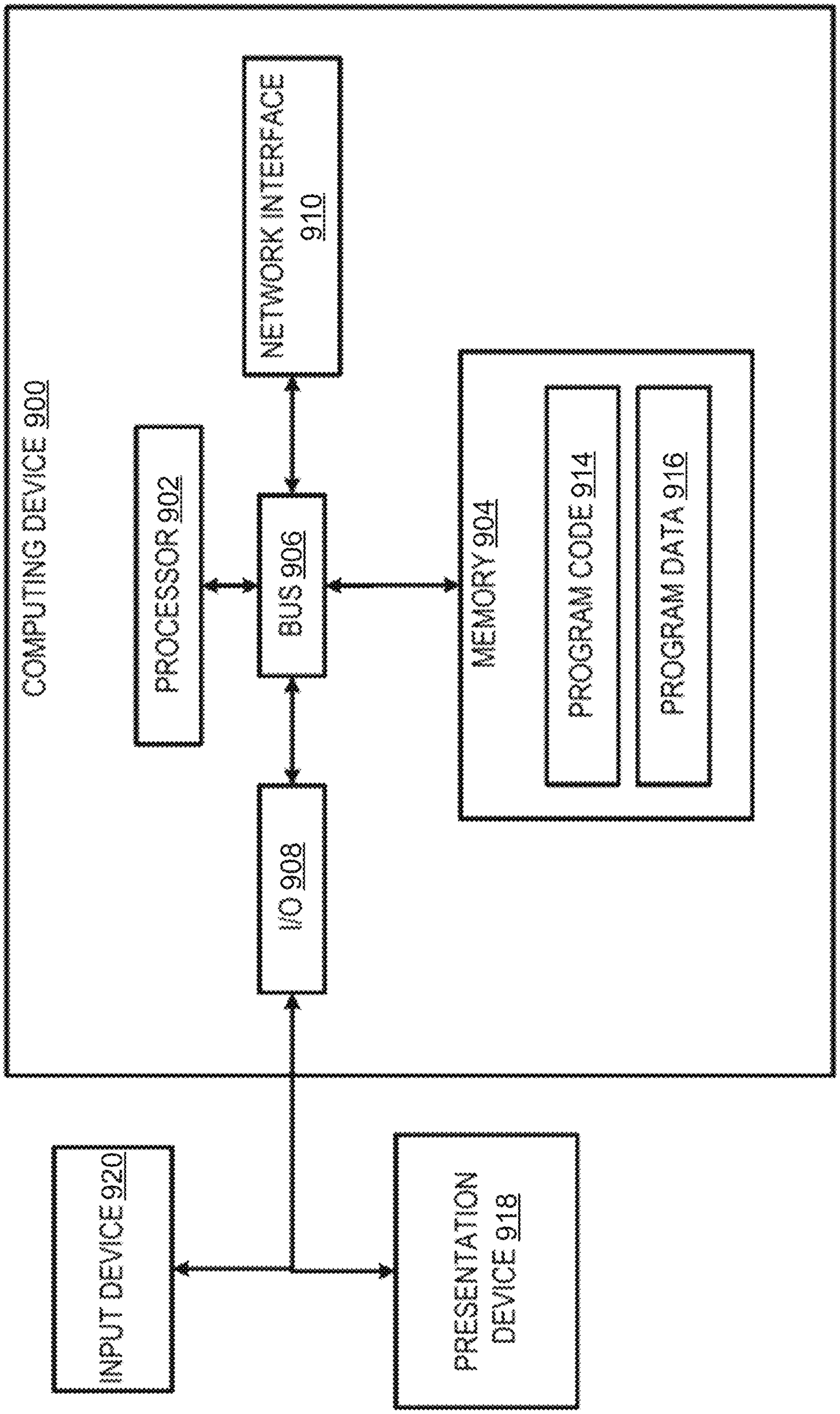
FIG. 9 is a diagram illustrating an example of the computing system 900.

Any suitable computing system or group of computing systems can be used for performing the operations described herein. For example, FIG. 9 is a diagram illustrating an example of the computing system 900.

The depicted example of a computing system 900 includes a processor 902 communicatively coupled to one or more memory devices 904. The processor 902 executes computer-executable program code stored in a memory device 904, accesses information stored in the memory device 904, or both. Examples of the processor 902 include a microprocessor, an application-specific integrated circuit ("ASIC"), a field-programmable gate array ("FPGA"), or any other suitable processing device. The processor 902 can include any number of processing devices, including a single processing device.

A memory device 904 includes any suitable non-transitory computer-readable medium for storing program code 914 (e.g., the code used for various operations of the sampling rate converter 108), program data 916 (e.g., the types of measurement selected to be calculated by the metering measurement calculator 112), or both. A computer-readable medium can include any electronic, optical, magnetic, or other storage devices capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device can read instructions. The instructions may include processor-specific instructions generated by a compiler or an interpreter from code written in any suitable computer-programming language, including, for example, C, C++, C #, Visual Basic, Java, Python, Perl, JavaScript, and ActionScript.

The computing system 900 executes program code 914 that configures the processor 902 to perform one or more of the operations described herein. The program code may be resident in the memory device 904 or any suitable computer-readable medium and may be executed by the processor 902 or any other suitable processor.

In some implementations, one or more memory devices 904 stores program data 916 that includes one or more datasets described herein. In some implementations, one or more of data sets, models, and functions are stored in the same memory device (e.g., one of the memory devices 904). In additional or alternative implementations, one or more of the programs, data sets, models, and functions described herein are stored in different memory devices 904 accessible via a data network. One or more buses 906 are also included in the computing system 900. The bus 906 communicatively couples one or more components of a respective one of the computing system 900.

In some implementations, the computing system 900 also includes a network interface device 910. The network interface device 910 includes any device or group of devices suitable for establishing a wired or wireless data connection to one or more data networks. Non-limiting examples of the network interface device 910 include an Ethernet network adapter, a modem, and/or the like. The computing system 900 is able to communicate with one or more other computing devices via a data network using the network interface device 910.

The computing system 900 may also include a number of external or internal devices, such as an input device 920, a presentation device 918, or other input or output devices. For example, the computing system 900 is shown with one or more input/output ("I/O") interfaces 908. An I/O interface 908 can receive input from input devices or provide output to output devices. An input device 920 can include any device or group of devices suitable for receiving visual, auditory, or other suitable input that controls or affects the operations of the processor 902. Non-limiting examples of the input device 920 include a touchscreen, a mouse, a keyboard, a microphone, a separate mobile computing device, etc. A presentation device 918 can include any device or group of devices suitable for providing visual, auditory, or other suitable sensory output. Non-limiting examples of the presentation device 918 include a touchscreen, a monitor, a speaker, a separate mobile computing device, etc.

Although FIG. 9 depicts the input device 920 and the presentation device 918 as being local to the computing device, other implementations are possible. For instance, in some implementations, one or more of the input device 920 and the presentation device 918 can include a remote client-computing device that communicates with the computing system 900 via the network interface device 610 using one or more data networks.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as an open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method of processing power signals comprising:

receiving, at an analog to digital converter (ADC), an analog poly-phase signal associated with power delivered using alternating current (AC), the analog poly-phase signal having at least one current component and at least one voltage component comprising a reference voltage component;

converting, using the ADC, the analog poly-phase signal to a digital poly-phase signal sampled at a first sampling rate;

detecting, by a peak voltage detector, peaks of the at least one voltage component of the digital poly-phase signal and, when the peaks are at or above a voltage threshold:

detecting, using a fundamental frequency detector, a fundamental frequency of the analog poly-phase signal based on the digital poly-phase signal, wherein the fundamental frequency detector comprises a band-pass filter and a zero-crossing detector;

determining, by a sampling rate converter, a second sampling rate, wherein the second sampling rate is set according to where $$F_s = 2^m \frac{F_L}{N_{LC}},$$

$F_S$ is the second sampling rate, $F_L$ is the fundamental frequency, $N_{LC}$ is a maximum integer number of cycles in a predetermined time period, and m is a positive integer;

resampling the digital poly-phase signal at the second sampling rate, wherein the resampling the digital poly-phase signal at the second sampling rate comprises up-sampling the digital poly-phase signal by a factor of L, L being an integer, and down-sampling the up-sampled digital poly-phase signal by a factor of M, wherein $M=LF_{ADC}/F_S$, where $F_S$ is the second sampling rate, and $F_{ADC}$ is the first sampling rate;

for each cycle of the resampled digital poly-phase signal:

transforming the resampled digital poly-phase signal to a frequency-domain signal using Fast Fourier Transformation (FFT);

calculating a phase angle of the reference voltage component based on the frequency-domain signal;

adjusting the resampled digital poly-phase signal by compensating the calculated phase angle of the reference voltage component; and transforming the adjusted resampled digital poly-phase signal to an updated frequency-domain signal using FFT;

calculating, by a metering measurement calculator, one or more measurements based on the updated frequency-domain signal; and determining an energy consumption based on the one or more measurements; and wherein when the peaks are below the voltage threshold, the peak voltage detector generates a switch off signal to disable the fundamental frequency detector;

wherein detecting the fundamental frequency comprises:

applying the digital poly-phase signal to the band-pass filter, wherein the band-pass filter has a passband;

detecting, by the zero-crossing detector, two adjacent zero-crossings; and calculating the fundamental frequency based on the two adjacent zero-crossings, and wherein the band-pass filter is a $8^{th}$ order elliptic biquadratic band-pass filter.

2. The method of claim 1, wherein the analog poly-phase signal is a three-phase power signal, and the reference voltage component is a phase A line voltage.

3. The method of claim 1, wherein the passband is from 50 Hz to 60 Hz.

4. The method of claim 1, wherein the $8^{th}$ order elliptic biquadratic band-pass filter comprises four biquadratic filters in cascade.

5. The method of claim 1, wherein the determining the second sampling rate comprises:

setting the second sampling rate as an integer multiple of the fundamental frequency.

6. The method of claim 1, wherein the up-sampling and the down-sampling is by using a poly-phase resampler comprising a poly-phase filter bank.

7. A device connected to a power distribution network, comprising:

sensing circuitry configured to receive an analog poly-phase signal associated with power delivered using alternating current (AC) over the power distribution network, wherein the analog poly-phase signal having at least one current component and at least one voltage component comprising a reference voltage component;

an analog to digital converter (ADC) configured to convert the analog poly-phase signal to a digital poly-phase signal sampled at a first sampling rate; and a power signal processing unit connected to the ADC and comprising:

a peak voltage detector;

a fundamental frequency detector comprising a band-pass filter and a zero-crossing detector;

a sampling rate converter; and a metering measurement calculator;

a processor configured to execute computer-readable instructions; and a memory configured to store the computer-readable instructions that, when executed by the processor, cause the power signal processing unit to perform operations comprising:

detecting, by the peak voltage detector, peaks of the at least one voltage component of the digital poly-phase signal and, when the peaks are at or above a voltage threshold:

detecting, by the fundamental frequency detector, a fundamental frequency of the analog poly-phase signal based on the digital poly-phase signal;

determining, by the sampling rate converter, a second sampling rate, wherein the second sampling rate is set according to $$F_s = 2^m \frac{F_L}{N_{LC}},$$

where $F_S$ is the second sampling rate, $F_L$ is the fundamental frequency, $N_{LC}$ is a maximum integer number of cycles in a predetermined time period, and m is a positive integer;

resampling the digital poly-phase signal at the second sampling rate, wherein the resampling the digital poly-phase signal at the second sampling rate comprises up-sampling the digital poly-phase signal by a factor of L, L being an integer, down-sampling the up-sampled digital poly-phase signal by a factor of M, wherein $M=LF_{ADC}/F_S$, where $F_S$ is the second sampling rate, and $F_{ADC}$ is the first sampling rate;

for each cycle of the resampled digital poly-phase signal:

transforming the resampled digital poly-phase signal to a frequency-domain signal using Fast Fourier Transformation (FFT);

calculating a phase angle of the reference voltage component based on the frequency-domain signal;

adjusting the resampled digital poly-phase signal by compensating the calculated phase angle of the reference voltage component; and transforming the adjusted resampled digital poly-phase signal to an updated frequency-domain signal using FFT;

calculating, by the metering measurement calculator, one or more measurements based on the updated frequency-domain signal; and determining an energy consumption based on the one or more measurements; and wherein when the peaks are below the voltage threshold, the peak voltage detector is configured to generate a switch off signal to disable the fundamental frequency detector;

wherein detecting the fundamental frequency comprises:

applying the digital poly-phase signal to the band-pass filter, wherein the band-pass filter has a passband;

detecting, by the zero-crossing detector, two adjacent zero-crossings; and calculating the fundamental frequency based on the two adjacent zero-crossings, and wherein the band-pass filter is a $8^{th}$ order elliptic biquadratic band-pass filter.

8. The device of claim 7, wherein the analog poly-phase signal is a three-phase power signal, and the reference voltage component is a phase A line voltage.

9. The device of claim 7, wherein the $8^{th}$ order elliptic biquadratic band-pass filter comprises four biquadratic filters in cascade.

10. The device of claim 7, wherein the determining the second sampling rate comprises:

setting the second sampling rate as an integer multiple of the fundamental frequency.

11. The device of claim 7, wherein the up-sampling and the down-sampling is by using a poly-phase resampler comprising a poly-phase filter bank.

12. An electronic energy meter, comprising:

a sensor configured to receive an analog poly-phase signal associated with power delivered using alternating current (AC) over a power distribution network, the analog poly-phase signal having at least one current component and at least one voltage component comprising a reference voltage component;

an analog to digital converter (ADC) configured to convert the analog poly-phase signal to a digital poly-phase signal sampled at a first sampling rate; and a power signal processing unit connected to the ADC and comprising:

a peak voltage detector;

a fundamental frequency detector;

a sampling rate converter; and a metering measurement calculator;

the power signal processing unit being configured to:

detect, by the peak voltage detector, peaks of the at least one voltage component of the digital poly-phase signal and, when the peaks are at or above a voltage threshold:

detect, by the fundamental frequency detector, a fundamental frequency of the analog poly-phase signal based on the digital poly-phase signal;

determine, by the sampling rate converter, a second sampling rate, wherein the second sampling rate is set according to $$F_s = 2^m \frac{F_L}{N_{LC}},$$

where $F_S$ is the second sampling rate, $F_L$ is the fundamental frequency, $N_{LC}$ is a maximum integer number of cycles in a predetermined time period, and m is a positive integer;

resample the digital poly-phase signal at the second sampling rate, wherein the resampling the digital poly-phase signal at the second sampling rate comprises up-sampling the digital poly-phase signal by a factor of L, L being an integer, down-sampling the up-sampled digital poly-phase signal by a factor of M, wherein $M=LF_{ADC}/F_S$, where $F_S$ is the second sampling rate, and $F_{ADC}$ is the first sampling rate;

for each cycle of the resampled digital poly-phase signal:

transform the resampled digital poly-phase signal to a frequency-domain signal using Fast Fourier Transformation (FFT);

calculate a phase angle of the reference voltage component based on the frequency-domain signal;

adjust the resampled digital poly-phase signal by compensating the calculated phase angle of the reference voltage component; and transform the adjusted resampled digital poly-phase signal to an updated frequency-domain signal using FFT;

calculate, by the metering measurement calculator, one or more measurements based on the updated frequency-domain signal; and determine an energy consumption based on the one or more measurements; and wherein when the peaks are below the voltage threshold, the peak voltage detector is configured to generate a switch off signal to disable the fundamental frequency detector;

wherein the fundamental frequency detector comprises a band-pass filter and a zero-crossing detector and detects the fundamental frequency by:

applying the digital poly-phase signal to the band-pass filter, wherein the band-pass filter has a passband;

detecting, by the zero-crossing detector, two adjacent zero-crossings; and calculating the fundamental frequency based on the two adjacent zero-crossings, and wherein the band-pass filter is a $8^{th}$ order elliptic biquadratic band-pass filter.

13. The electronic energy meter of claim 12, wherein the power signal processing unit is configured to determine the second sampling rate by setting the second sampling rate as an integer multiple of the fundamental frequency.

* * * * *